Oct. 6, 1970 H. KORETZKY ET AL 3,532,541
BORON CONTAINING COMPOSITE METALLIC FILMS AND PLATING
BATHS FOR THEIR ELECTROLESS DEPOSITION
Filed June 19, 1967

INVENTOR.
Herman Koretzky
BY Arnold F. Schmeckenbecher
Sughrue, Rothwell, Mion, Zinn & Macpeak
ATTORNEY United States Patent Office 3,532,541
Patented Oct. 6, 1970

1 2

3,532,541
BORON CONTAINING COMPOSITE METALLIC FILMS AND PLATING BATHS FOR THEIR ELECTROLESS DEPOSITION

Herman Koretzky and Arnold F. Schmeckenbecher, Poughkeepsie, N.Y., assignors to International Business Machines Corporation, Armonk, N.Y., a corporation of New York Filed June 19, 1967, Ser. No. 646,839
Int. Cl. C23c 3/02
U.S. Cl. 117—240 8 Claims

ABSTRACT OF THE DISCLOSURE

Nickel-iron-molybdenum-boron films having a rectangular magnetic hysteresis loop for memory units, plating baths comprising an alkaline solution of nickel, iron and molybdenum salts and a compound having a boron-nitrogen bond and a method for electrolessly coating nickel-iron-molybdenum-boron films on substrates by chemical reduction from the aforesaid plating bath.

BACKGROUND OF THE INVENTION

Figures 1, 2:
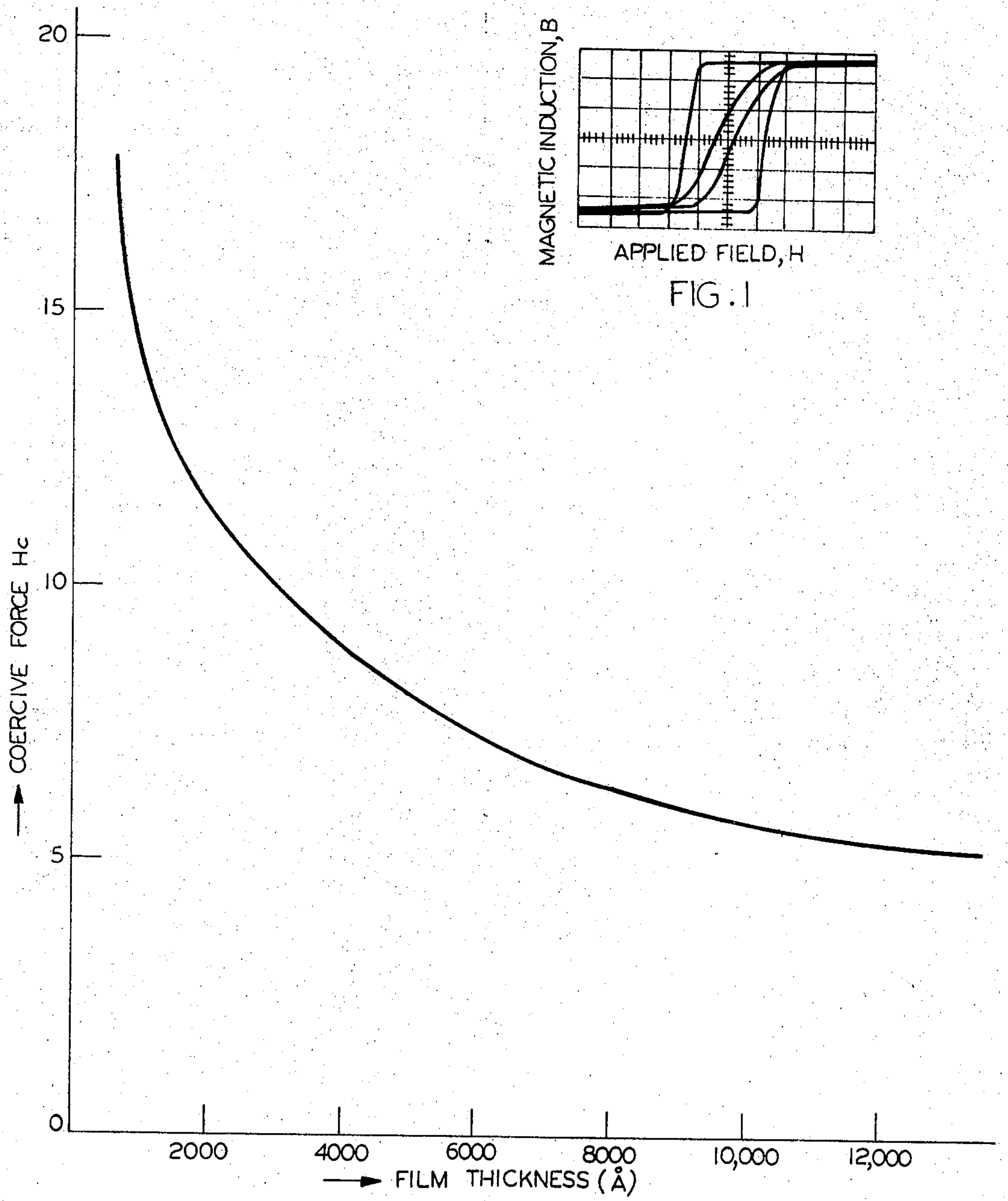

The present invention relates to nickel-iron-molybdenum-boron films for memory elements having a rectangular magnetic hysteresis loop.

The present invention also relates to plating baths suitable for depositing nickel-iron-molybdenum-boron films and to an electroless chemical reduction plating method employing said plating baths.

The prior art

Materials having a rectangular magnetic hysteresis loop are desirable for the manufacture of memory units due to their ability to retain a magnetic impulse in the so-called easy direction for long periods of time. The prior art has been faced with the contant search for metallic materials or films having a rectangular hysteresis loop. By the present invention, materials having an almost perfect rectangular hysteresis loop are provided.

According to the present invention these materials or films comprise layers composed of nickel, iron, molybdenum and boron.

In the prior art, it is known to electrolessly deposit various metallic surfaces by chemical reduction utilizing boron compounds. However, no method has heretofore been suggested for co-depositing three or more metals in addition to boron as a homogeneous film or layer. By the method of the present invention, a layer comprising nickel, iron, molybdenum and boron may conveniently and advantageously be coated onto a suitable substrate for use in magnetic memory devices.

Brief summary of the present invention

The magnetic memory films or materials of the present invention comprise a nickel-iron-molybdenum-boron film wherein the film contains about 1–4% molybdenum, about 17–27% iron, about 0.5–1% boron and the balance nickel. It has been found that such a film possesses a rectangular magnetic hysteresis loop having characteristics heretofore unattainable in film memory units.

According to the present invention, there is also provided a plating bath useful for electrolessly depositing the above noted films. Generally, the electroless plating baths of the present invention comprise alkaline solutions of nickel, iron and molybdenum salts, a boron compound selected from the group consisting of boranes and borazoles and a complexing agent.

Further, according to the present invention, there is also provided a method for electrolessly depositing the above noted films on suitable substrates for use in magnetic memory devices. Generally, the method according to the present invention comprises cleaning the substrate, sensitizing it, followed by immersion at suitable temperatures in the above noted plating baths until layers of suitable thicknesses are formed thereon.

DETAILED DESCRIPTION OF THE INVENTION

The nickel-iron-molybdenum-boron films of the present invention have an almost perfect rectangular magnetic hysteresis loop. The magnetic hysteresis loop in the easy direction of the films according to the present invention is illustrated in FIG. 1, wherein the outer solid lines denote the magnetic hysteresis loop in the easy direction and the inner solid lines depict the magnetic hysteresis loop in the hard direction. FIG. 1 depicts the conventional plot employed to represent the B–H or magnetic hysteresis loop wherein magnetic induction "B" is plotted against the applied field H for a particular material. In FIG. 1 the B–H loop for the film produced in Example 1 is set forth. In FIG. 1, the horizontal axis is defined as Applied Field H, wherein each divsion represents 4 oersteds. The vertical axis is defined as Magnetic Induction B, wherein each division represents 0.2 Maxwell.

FIG. 2 depicts a plot of the coercive force, $H_C$ in oersteds against the thickness of the nickel-iron-molybdenum-boron film produced according to Example 1. As is apparent, films having a coercive force of less than 6 oe. can be produced according to the present invention.

As noted above, the films of the present invention generally comprise about 1–4% molybdenum, about 17 to 27% iron, about 0.5 to 1% boron and the balance nickel. Obviously, the properties of the magnetic material can be varied within wide ranges by varying the amount of materials in the film. The ranges of proportions given above constitute generally the amounts necessary to yield a film having the usually desired rectangular magnetic hysteresis loop. Obviously, if this characteristic is not desired in the deposited film, the amounts of metals may be varied to include values outside the stated ranges.

The method of depositing the films of the present invention and the plating baths suitable therefor, are based on our discovery that a composite film of boron and two or more metals may be deposited electrolessly by immersion of a suitably cleaned and sensitized substrate into an alkaline solution containing soluble salts of the metals desired to be plated, a compound containing a boron-nitrogen bond and a complexing agent.

Although the invention is described with reference to the deposition of a nickel-iron-molybdenum-boron film, it is to be understood that the method according to the present invention is suitable for depositing any layer comprising two or more metals and boron. The metals may be supplied to the plating bath as soluble salts. For the deposition of a nickel-iron-molybdenum-boron film, the metals are typically added to the plating solution as nickelous chloride, ferrous ammonium sulfate and molybdenum dichloride. However, the metals may be added to the plating solution in the form of any available salts soluble therein; the only requirement being that the anion thereof be inert with respect to the plating reaction. Generally, these metals may be added as chlorides, sulfates, nitrates, acetates, sulfamates etc.

It is to be noted that many molybdenum salts are practically insoluble in cold water but more soluble in alkaline solutions. Therefore, the molybdenum salt is usually added to the plating bath as a solid after the bath has been made alkaline or as a solution in an alkaline medium.

Although water is the typical solvent employed, other water miscible solvents such as alcohols, including methanol and ethanol, dimethyl sulfoxide or tetrahydrofuran may also be employed.

Typical agents for rendering the plating bath alkaline are ammonia, triethanolamine, glycine, soluble metal hydroxides and mixtures thereof. The particular alkaline agent employed, however, is not critical.

Many of the above noted alkaline agents such as ammonia, triethanolamine, glycine, etc. serve the dual function of not only rendering the solution alkaline but also serving as a complexing agent to sequester the metallic ions. Additionally, other complexing agents may be added to the plating bath. Such complexing agents contain one or more of the following functional groups: primary amino group ($—NH_2$), secondary amino group (>NH), tertiary amino group (>N—), imino group (=NH), carboxy group (—COOH), and hydroxy group (—OH).

Complexing agents which do not act as alkalizers are sodium potassium tartrate, sodium citrate and sodium hydroxy acetate.

The boron compound in the plating bath acts as a chemical reducing agent. Suitable boron compounds are the boranes and borazoles corresponding to the general formulae:

$$R_3N—BH_3,\ R_2N—BH_2 \text{ and } (RN—BH)_n$$

wherein R may be alkyl, such as a methyl or butyl, a cyclic radical as in pyridine borane ($C_5H_5NBH_5$) or other organic radicals, or hydrogen; and $n$ is a positive integer from 1 to 3. The boranes and borazoles may also be mixed with hypophosphites or hydrazines before addition to the plating baths. These latter additives perform the function of being additional reducing agents, and of serving to alter the composition of the depositing films.

The amounts of materials added to the plating baths are not critical. Obviously, these amounts may be varied, changed or altered according to the characteristics desired for the ultimate deposited film. For purposes of depositing a nickel-iron-molybdenum-boron film having optimum rectangular magnetic hysteresis loop characteristics, the bath composition should be formulated so as to deposit a film containing about 1–4% molybdenum, about 17–27% iron, about 0.5–1% boron and the balance nickel. The bath composition necessary to yield such a film is hereinafter set forth in more detail.

The method according to the present invention of depositing two or more metals in combination with boron on a suitable substrate generally comprises cleaning the substrate and activating it.

Any method whereby the substrate is rigorously cleaned and freed of all interfering matter may be employed. Typically, the copper substrate is cleaned by dipping in hydrochloric acid or similar acid solutions, such as Shipley Chempolish No. 14, and rinsed.

The copper substrate is suitably activated by dipping in a palladium chloride solution, rinsed and dried. This procedure renders the copper surface of the substrate catalytic to the deposition of the metals and boron to its surface. Surfaces of noble metals, glass or plastics can be activated by the procedures known in the art, such as a dip in stannous chloride solution followed by a dip in palladium chloride solution.

Although we do not wish to be bound by any theory it is thought that the complexing agent serves to sequester the metallic ions contained in the plating bath, thereby preventing precipitation of metal hydroxide and stabilizing the borane containing solution against reduction by the latter. When, however, the bath comes in contact with a suitable substrate surface, the chemical reduction process is catalyzed, leading to the deposition on the surface is thought that the complexing agent serves to sequester therof of a composite layer of the metals and boron. Therefore, it is necessary that the complexing agent be present in the plating bath prior to the addition of the metal salts and the boron compound.

The invention is further illustrated by the following examples which are intended to be illustrative and not limitative of the invention the scope of which is limited only by the appended claims.

EXAMPLE 1

A plating solution was prepared by mixing a solution of 20.2 millimols of dimethylamine borane in 140 milliliters of water, a solution of 56.2 millimols of nickelous chloride in 50 milliliters of water, a solution of 4.0 millimols of ferrous ammonium sulfate in 40 milliliters of water, a solution of 115 millimols of sodium potassium tartrate in 50 milliliters of water, a solution of 2.5 millimols of molybdenum dichloride in 400 ml. of 28% ammonia solution (containing 100 grams or 5.0 mols $NH_3$) and water to bring the volume of the mixture to 1000 ml. The plating solution was passed in a glass beaker and covered with a layer of xylene. The plating solution was heated to 65° C. and kept at that temperature in a constant temperature bath.

A circular sheet of precipitation hardened beryllium-copper alloy "Berylco No. 10" of about 0.003 inch thickness and one inch diameter was cleaned by dipping in 10% hydrochloric acid, rinsed and dipped into a 0.1% palladium chloride solution for five seconds at room temperature, rinsed and put into the above plating solution at 65° C. for 120 minutes. An orienting field of 40 oersteds was applied in the plane of the disc during deposition. The field was generated from a set of Helmholtz coils mounted around the plating vessel.

A deposit of 10,700 angstroms thickness was formed, which contained 22.8% iron, 1.2% molybdenum, about 1% boron and the balance nickel. The B–H loop taken at 30 kc. of the deposit was almost rectangular in the easy direction and narrow in the hard direction as shown in FIG. 1. The coercive force was about 5 oe., the anistropy field was about 7 oe., the saturation magnetization $B_s$ was about 10,000 gauss.

The experiment was repeated using various plating times. The coercive force as a function of the plating time or film thickness is shown in FIG. 2.

EXAMPLE 2

Nickel-iron-molybdenum-boron films were also deposited on narrow copper strips which have been photoetched out of copper sheeting. For orientation of the deposit in the circumferential direction, a current (DC or AC) sufficient to generate a field of about 10 oe. on the surface of the strip was passed through the strip during plating.

The chemical composition and magnetic characteristics of the deposit was similar to that of Example 1.

EXAMPLE 3

A plating solution was prepared by mixing a solution of 74 millimols of dimethylamine borane in 440 ml. of water, a solution of 56.2 millimols of nickelous sulfate in 50 ml. of water, a solution of 2.0 millimols of ferric chloride in 40 ml. of water, a solution of 115 millimols of sodium potassium tartrate in 50 ml. of water, a solution of 1.0 millimols of molybdenum dichloride in 240 ml. of 28% ammonia solution, and water to bring the volume of the mixture to 1000 ml.

A glass slide of two inches by three inches was soaked in chromic-sulfuric acid, rinsed, soaked for 30 minutes in one normal sodium hydroxide solution, rinsed, dipped for thirty seconds at room temperature in a solution of ten grams stannous chloride in a mixture of 20 ml. concentrated hydrochloric acid and 80 ml. water, rinsed, dipped for thirty seconds at room temperature in a 0.1% palladium chloride solution and rinsed. The dips in stannous chloride and palladium chloride solutions were repeated three times.

The glass slide then was put in the above plating bath at 25° C. and left in for 200 minutes, An orienting field was applied as in Example 1.

A metal deposit formed on the glass, which had a square 30 kc. B–H loop in the easy direction and an almost closed loop in the hard direction. The material was close to zero magnetostrictive.

The properties of the magnetic film can be varied within wide ranges by varying one or more plating parameters such as plating time, temperature, concentration of reducing agents, concentration of alkalyzing agents, concentration of complexing agents, concentrations of metallic salts, outside pressure, solvents, etc.

Moreover, the plating baths and method according to the present invention may be employed to deposit other than magnetic layers and, indeed, are suitable for plating any composite metallic layers having two or more metals and boron.

Films of uniform thickness can be plated on flat, solid surfaces, wires, conducting strip lines and other more intricate shapes and structures. The magnetic films are suitable for magnetic keepers, as magnetic flux closure material around conducting strip lines and coupled film memory devices, as magnetic shields, etc.

To further aid in an understanding of the present invention, the plating bath most preferably contains:

From about 5 to about 100 millimols per liter of reducing agent;
From about 20 to about 100 millimols per liter of nickel ions;
From about 1 to about 10 millimols per liter of irons; and
From about 1 to about 15 millimols per liter of molybdenum ions.

The plating bath is preferably maintained at a temperature between 15 and 99° C. when the substrate is contacted with the plating bath.

Further, this substrate is most preferably contacted with the plating bath for a time sufficient to deposit thereon a film having a thickness of from about 200 to about 100,000 A.

Obvious modifications will become apparent to those skilled in the art. The scope of the invention is limited only by the appended claims.

We claim:

1. A method for electrolessly depositing a magnetic film consisting essentially of from about 1% to about 4% molybdenum, from about 17% to about 27% iron, from about 0.5% to about 1% boron, the balance being nickel, comprising:

contacting a substrate with an alkaline plating bath consisting essentially of a solvent containing:

from about 5 to 100 millimols per liter a soluble reducing agent containing a boron-nitrogen bond selected from the group consisting of materials corresponding to the general formulas $R_3N—BH_3$, $$R_2N—BH_2$$

$(RN—BH)_n$ and pyridine borane wherein $n$ is a positive integer from 1 to 3, and R is selected from the group consisting of methyl, butyl, and hydrogen, from about 20 to about 100 millimols per liter of nickel ions, from about 1 to about 10 millimols per liter of iron ions, from about 1 to about 15 millimols per liter of molybdenum ions, and a complexing agent containing at least one functional group selected from the class consisting of primary amino, secondary amino, tertiary amino, imino, carboxy and hydroxy.

2. A method according to claim 1 wherein said plating bath is rendered alkaline by the presence of a member selected from the group consisting of ammonia, triethanolamine and glycine.

3. A method according to claim 2 wherein said member also functions as the complexing agent.

4. A method according to claim 1 wherein said solvent is selected from the group consisting of water, alcohols such as methanol and ethanol, dimethylsulfoxide and tetrahydrofuran.

5. The method according to claim 1 wherein said substrate is contacted with said plating bath at a temperature between 15 and 99° C.

6. The method according to claim 1 wherein said substrate is contacted with said plating bath for a time sufficient to deposit thereon a film having a thickness of from about 200 to about 100,000 A.

7. The process of claim 1 which further comprises: depositing said film in a magnetic orienting film, whereby there is imparted to said magnetic film a substantially rectangular magnetic hysteresis loop in the easy direction.

8. The process of claim 1 wherein said complexing agent is selected from the group consisting of ammonia, triethanolamine, glycine, sodium potassium tartrate, sodium citrate and sodium hydroxy acetate.

References Cited

UNITED STATES PATENTS

| | | | |
|---|---|---|---|
| 3,140,188 | 7/1964 | Zirngiebl et al. | 106—1 |
| 3,234,031 | 2/1966 | Zirngiebl et al. | 106—1 |
| 3,295,999 | 1/1967 | Klein et al. | 106—1 |
| 3,379,539 | 4/1968 | McGrath et al. | 106—1 |
| 3,385,725 | 5/1968 | Schmeckenbecker | 106—1 XR |

JULIUS FROME, Primary Examiner

L. B. HAYES, Assistant Examiner

U.S. Cl. X.R.

106—1; 117—47, 130, 160

UNITED STATES PATENT OFFICE

CERTIFICATE OF CORRECTION

Patent No. 3,532,541 Dated October 6, 1970

Inventor(s) Herman Koretzky et al.

It is certified that error appears in the above-identified patent and that said Letters Patent are hereby corrected as shown below:

Claim 1, line 8, before "a" insert -- of --. Column 5, line 24, "irons" should read -- iron ions --.

Signed and sealed this 9th day of March 1971.

(SEAL)
Attest:

EDWARD M.FLETCHER,JR.
Attesting Officer

WILLIAM E. SCHUYLER, JR.
Commissioner of Patents